United States Patent
Nishikawa

(10) Patent No.: US 9,797,950 B2
(45) Date of Patent: Oct. 24, 2017

(54) SEMICONDUCTOR DEVICE, ELECTRONIC DEVICE, AND SELF-DIAGNOSIS METHOD FOR SEMICONDUCTOR DEVICE

(71) Applicant: Renesas Electronics Corporation, Koutou-ku, Tokyo (JP)

(72) Inventor: Takuro Nishikawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/007,246

(22) Filed: Jan. 27, 2016

(65) Prior Publication Data
US 2016/0274185 A1 Sep. 22, 2016

(30) Foreign Application Priority Data
Mar. 20, 2015 (JP) .................. 2015-058012

(51) Int. Cl.
*G01R 31/3185* (2006.01)

(52) U.S. Cl.
CPC ............... *G01R 31/318536* (2013.01); *G01R 31/318544* (2013.01); *G01R 31/318547* (2013.01); *G01R 31/318555* (2013.01); *G01R 31/318563* (2013.01); *G01R 31/318566* (2013.01); *G01R 31/318569* (2013.01); *G01R 31/318575* (2013.01)

(58) Field of Classification Search
CPC .... G01R 31/318536; G01R 31/318544; G01R 31/318566; G01R 31/318569; G01R 31/318563; G01R 31/318555
See application file for complete search history.

(56) References Cited

U.S. PATENT DOCUMENTS

| | | | | |
|---|---|---|---|---|
| 5,761,215 A * | 6/1998 | McCarthy | ........ | G01R 31/31858 714/726 |
| 5,951,703 A * | 9/1999 | Sprouse | ......... | G01R 31/318385 714/730 |
| 5,991,909 A * | 11/1999 | Rajski | .............. | G01R 31/31813 714/729 |
| 6,028,983 A * | 2/2000 | Jaber | .............. | G01R 31/318536 714/30 |
| 6,272,653 B1 * | 8/2001 | Amstutz | ............ | G01R 31/3187 714/724 |
| 6,405,355 B1 * | 6/2002 | Duggirala | ...... | G01B 31/318536 716/122 |

(Continued)

FOREIGN PATENT DOCUMENTS

JP 2009-188881 A 8/2009

*Primary Examiner* — Joseph D Torres
(74) *Attorney, Agent, or Firm* — Shapiro, Gabor and Rosenberger, PLLC

(57) ABSTRACT

A semiconductor device addresses to a problem in which a current consumption variation rate increases during BIST execution causing resonance noise generation in a power supply line. The semiconductor device includes a self-diagnosis control circuit, a scan target circuit including a combinational circuit and a scan flip-flop, and an electrically rewritable non-volatile memory. A scan chain is configured by coupling a plurality of the scan flip-flops. In accordance with parameters stored in the non-volatile memory, the self-diagnosis control circuit can change a length of at least one of a scan-in period, a scan-out period and a capture period, and can also change a scan start timing.

12 Claims, 13 Drawing Sheets

(56) References Cited

U.S. PATENT DOCUMENTS

| | | | | |
|---|---|---|---|---|
| 6,463,561 | B1* | 10/2002 | Bhawmik | G01R 31/31707 714/726 |
| 6,615,380 | B1* | 9/2003 | Kapur | G01B 31/318544 714/728 |
| 9,316,690 | B2* | 4/2016 | Zuo | G01B 31/318544 |
| 2003/0097614 | A1* | 5/2003 | Rajski | G01R 31/31858 714/30 |
| 2003/0167144 | A1* | 9/2003 | Wang | G06F 11/2242 702/119 |
| 2003/0188269 | A1* | 10/2003 | Mitra | G01R 31/3172 716/135 |
| 2003/0229886 | A1* | 12/2003 | Hasegawa | G01B 31/318563 717/115 |
| 2005/0055615 | A1* | 3/2005 | Agashe | G01R 31/318552 714/727 |
| 2005/0081130 | A1* | 4/2005 | Rinderknecht | G01R 31/318547 714/726 |
| 2005/0097418 | A1* | 5/2005 | Anzou | G01R 31/318555 714/733 |
| 2006/0150040 | A1* | 7/2006 | Bratt | G01B 31/318536 714/724 |
| 2007/0011514 | A1* | 1/2007 | Vranken | G01R 31/31921 714/724 |
| 2007/0011542 | A1* | 1/2007 | Mukherjee | G01B 31/318541 714/738 |
| 2007/0220389 | A1* | 9/2007 | Sato | G01R 31/31921 714/733 |
| 2008/0288838 | A1* | 11/2008 | Anzou | G11C 29/32 714/726 |
| 2009/0132882 | A1* | 5/2009 | Chen | G01B 31/318536 714/731 |
| 2009/0144592 | A1* | 6/2009 | Chakraborty | G01R 31/318583 714/726 |
| 2010/0169727 | A1* | 7/2010 | Ito | G01R 31/318591 714/726 |
| 2010/0211839 | A1* | 8/2010 | Almukhaizim | G06F 11/267 714/729 |
| 2011/0161756 | A1* | 6/2011 | Inagawa | G01B 31/318533 714/726 |
| 2011/0167310 | A1* | 7/2011 | Tung | G01B 31/318547 714/731 |
| 2011/0202799 | A1* | 8/2011 | Pagani | G01R 31/3025 714/27 |
| 2011/0231720 | A1* | 9/2011 | Zuo | G01B 31/318572 714/729 |
| 2012/0054564 | A1* | 3/2012 | Tiwary | G11C 29/36 714/718 |
| 2012/0072793 | A1* | 3/2012 | Rao | G01B 31/318541 714/719 |
| 2012/0242368 | A1* | 9/2012 | Nozuyama | G06F 17/5045 326/16 |

* cited by examiner

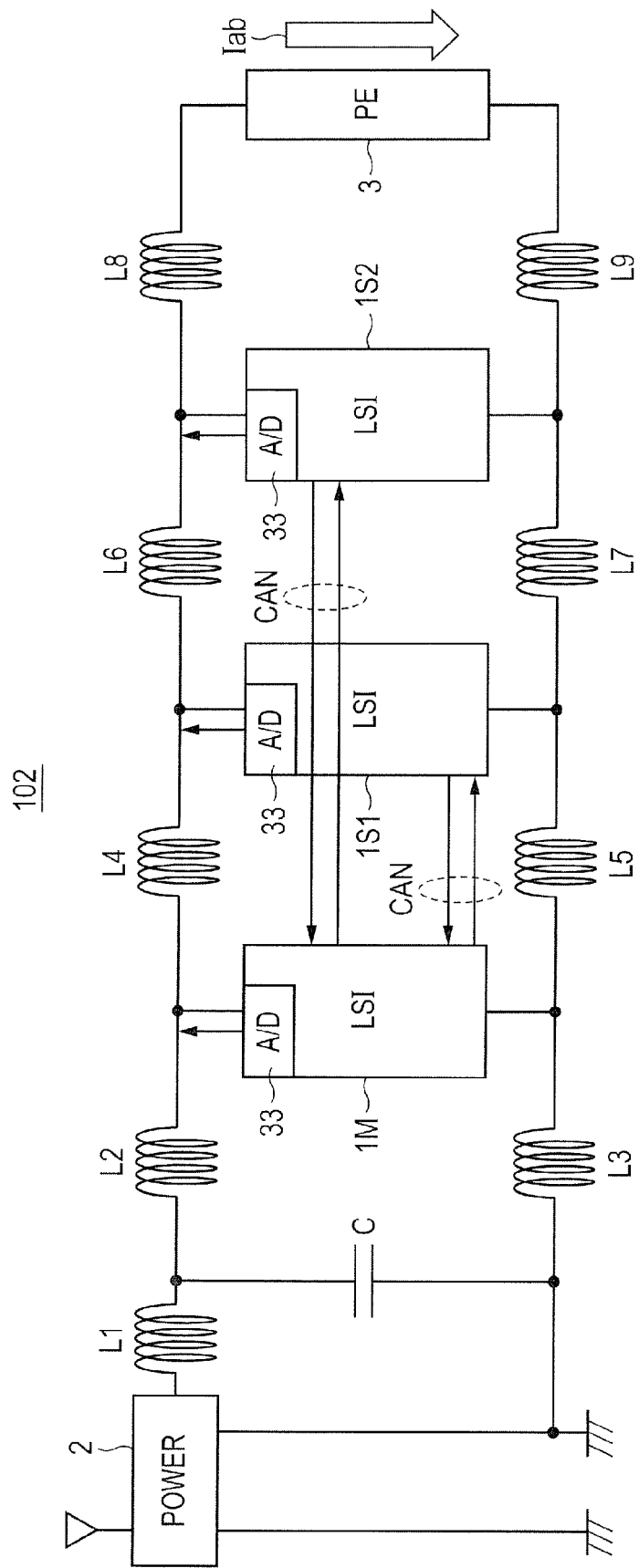

SEMICONDUCTOR DEVICE, ELECTRONIC DEVICE, AND SELF-DIAGNOSIS METHOD FOR SEMICONDUCTOR DEVICE

CROSS-REFERENCE TO RELATED APPLICATIONS

The disclosure of Japanese Patent Application No. 2015-058012 filed on Mar. 20, 2015 including the specification, drawings and abstract is incorporated herein by reference in its entirety.

BACKGROUND

The present disclosure relates to a semiconductor device and is applicable, for example, to a semiconductor device having a self-diagnosis function.

Recently, ISO26262 set by the International Organization for Standardization has been collecting attention as a functional safety standard for in-vehicle electronic devices. Functional safety refers to securing minimum tolerable safety by implementing a functional measure, should any element of an in-vehicle electronic device, for example, a microcontroller develop a fault. In the ISO26262, requesting a high fault detection rate, in-vehicle microcontrollers incorporate a scan circuit for performing a built-in self-test (BIST). Generally, in a microcontroller, a BIST is performed during a period between after the microcontroller is powered on and before the microcontroller starts real operation (in-vehicle control such as engine control and brake control). The BIST performed in an in-vehicle microcontroller is required to achieve a high fault detection rate in a predetermined amount of time, so that the BIST when performed involves a high rate of current consumption variation. Generally, it is known that, when the rate of current consumption variation is high in a circuit, resonance noise is generated in the power supply line in the circuit. A method to reduce power supply resonance noise is disclosed in Japanese Unexamined Patent Application Publication No. 2009-188881 (patent document 1).

SUMMARY

The present inventors have found that, when a BIST (logic BIST) is performed on a logic circuit, scan operation, particularly, scan shift operation and capture operation cause power supply noise generation.

In a shift operation through a scan chain, data is shifted from a scan-in to a scan out through the scan flip-flops configuring the scan chain. In a capture operation, after test data is set on the scan flip-flops, the circuit is operated in normal mode and operation results are taken into the scan flip-flops.

In a technique disclosed in the Japanese Unexamined Patent Application Publication No. 2009-188881, power supply noise is observed and the clock frequency of the circuit is adjusted so as to reduce the power supply noise. However, with the scan operation being different from normal operation, it is difficult to reduce noise during BIST operation using the technique disclosed in the Japanese Unexamined Patent Application Publication No. 2009-188881.

The objects and novel features of the present disclosure will become apparent from the following description of this specification and attached drawings.

A representative aspect of the present disclosure can be briefly described as follows.

Namely, for a semiconductor device, the length of at least one of the scan-in period, scan-out period and capture period can be changed, and the scan operation start time can also be changed.

According to the above semiconductor device, the rate of current consumption variation during a scan test can be lowered.

BRIEF DESCRIPTION OF THE DRAWINGS

FIG. 15 is a block diagram for explaining a second operation of the electronic device according to the application example 2.

DETAILED DESCRIPTION

In the following, an embodiment form, an embodiment example, and application examples of the present disclosure will be described with reference to drawings. In the following description, identical elements will be denoted by identical symbols and repetitive descriptions of such identical elements may be omitted.

First, a scan test included in a logic built-in self-test (BIST) will be described with reference to FIGS. 1 to 3.

Figure 1:
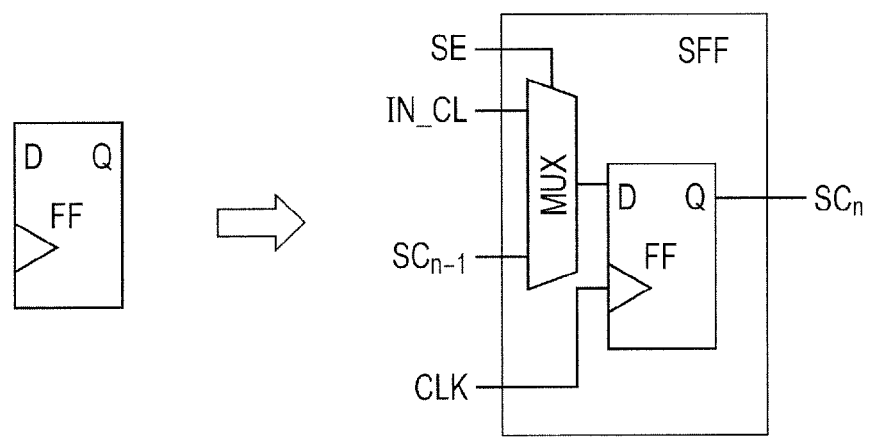
FIG. 1 is a diagram for explaining the configuration of a multiplexer-type scan flip-flop.
Figure 2:
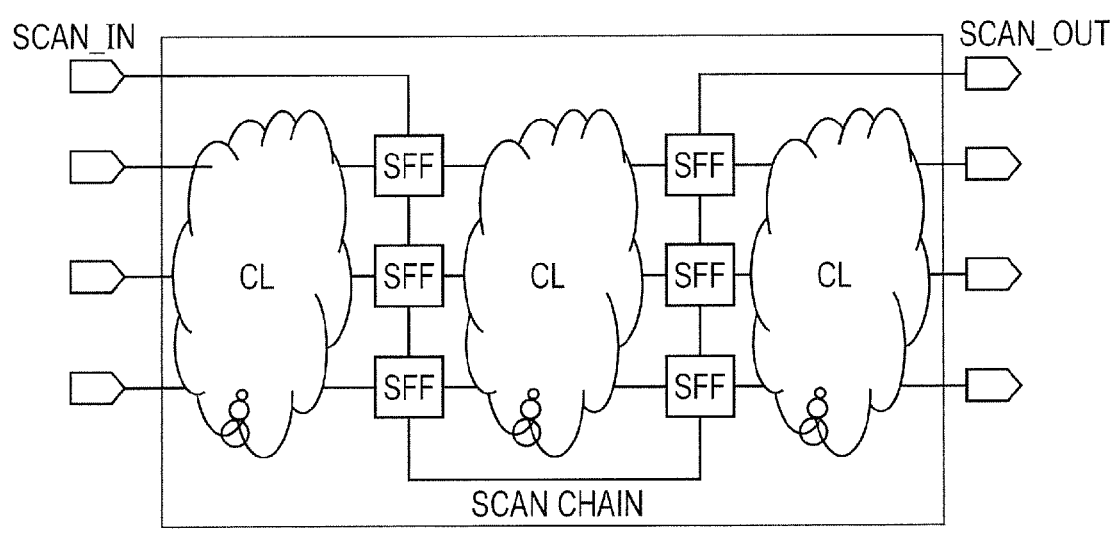
FIG. 2 is a diagram for explaining a scan test configuration.

FIG. 1 is a diagram showing the configuration of a multiplexer-type scan flip-flop circuit. FIG. 2 is a diagram showing a scan test configuration. FIG. 3 is a diagram showing scan test timing.

A scan test is based on a design-for-testability (DFT) technique which is a design method for easy testing. The technique is applied to random logic configuring a prescribed logic function realized by combining such logic circuits as, for example, AND circuits, OR circuits, inverters, and flip-flops. As shown in FIG. 1, in a scan test, a flip-flop (FF) included in a circuit to be tested is replaced with a scan flip-flop (SFF). A multiplexer-type scan flip-flop is configured with a multiplexer (MUX) and an ordinary flip-flop (FF) and uses a scan enable (SE) signal for switching between normal operation and test-mode operation. As shown in FIG. 2, in test mode, scan flip-flops included in a circuit are serially coupled to form a shift register, and a route (scan chain) is formed to enable control and observation of the scan flip-flops from input and output terminals of the scan test target block.

When the scan flip-flops are configured as described above, the scan flip-flops can be regarded as equivalent to the input and output terminals of the scan-test target block. Therefore, only combinational circuits (CL) become scan-test targets. Test patterns for combinational circuits (CL) can be automatically and efficiently generated by automatic test pattern generation (ATPG) which is an established technique.

Figure 3:
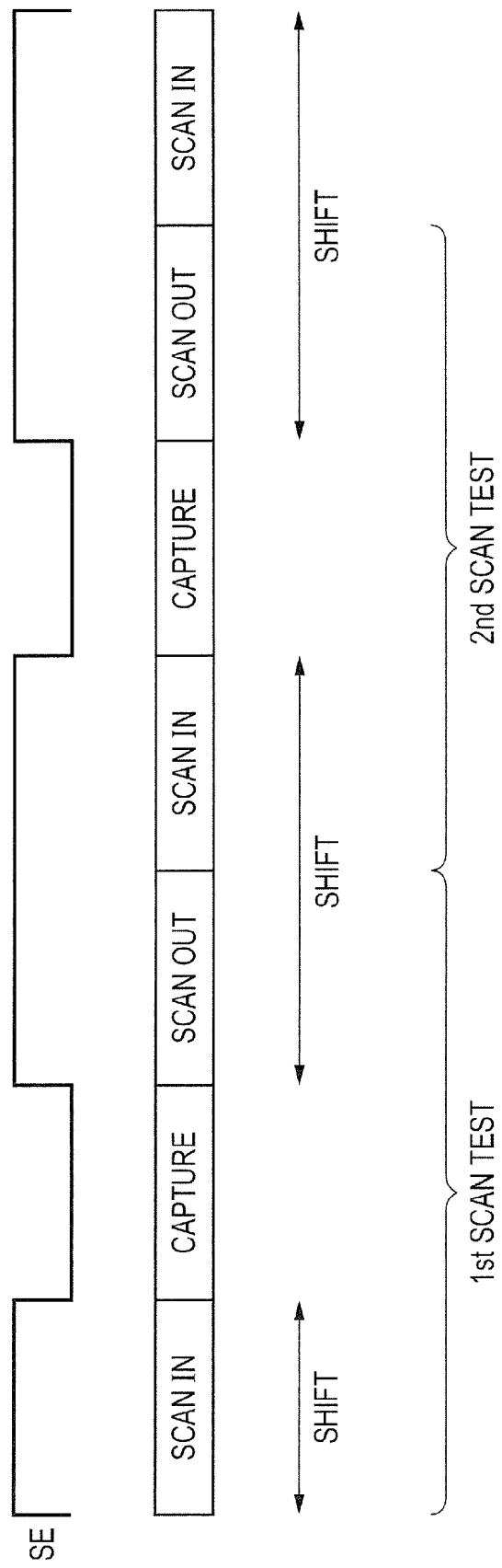
FIG. 3 is a diagram for explaining scan test timing.

In a scan test, as shown in FIG. 3, a series of operations, i.e. a scan-in (SCAN_IN), a capture (CAPTURE), and a scan-out (SCAN_OUT) are repeated plural times.

First, scan mode is set by a scan enable signal, then a test pattern is loaded into the scan flip-flops via a scan-in terminal (SCAN_IN). Next, normal operation mode is set by a scan enable signal, and combinational circuits between scan flip-flops are operated. Then, a test clock is operated and outputs of the combinational circuits are inputted to the scan flip-flops. Subsequently, scan mode is set again by a scan enable signal, and the values taken into the scan flip-flops are observed at the scan out terminal (SCAN_OUT).

In the first scan-in, scan mode is entered, and a test pattern is inputted to the scan flip-flops via the scan-in terminal. Since the test pattern is serially inputted, inputting the test pattern to all scan flip-flops requires shifting operation to be performed as many times as the number of the scan flip-flops (using as many clocks as the number of the scan flip-flops).

In the subsequent capture stage, normal operation mode is entered, and the combinational circuits between the scan flip-flops are operated. Subsequently, the outputs of the combinational circuits are inputted to the scan flip-flops (SFF).

In the subsequent scan-out, scan mode is entered again. The values stored in the scan flip-flops are observed at the scan out terminal. The values observed are compared with predetermined expected values (values to be obtained when there is no fault) to determine whether there is any fault. The scan-out is also a serial output, so that reading the values from all scan flip-flops requires shifting operation to be performed as many times as the number of scan flip-flops (using as many clocks as the number of the scan flip-flops).

Scan-in shifting and scan-out shifting involve large current consumption, whereas the current consumption for capture operation is small. Also, when plural BISTs are concurrently carried out, the current consumption involved in scan-in and scan-out operations further increases. When, in such a case, the rate of current consumption variation between scan-in/scan-out shifting and capturing becomes larger, the possibility of resonance noise generation in a power supply line increases.

Embodiment Form

A semiconductor device according to an embodiment form of the present disclosure will be described with reference to FIGS. 4 and 5.

Figure 4:
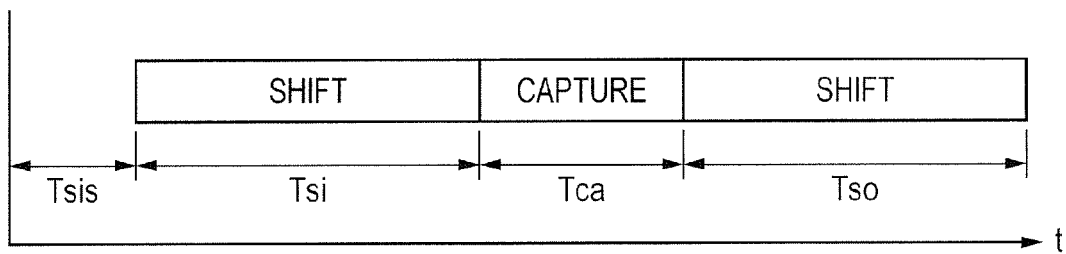
FIG. 4 is a timing diagram for explaining a semiconductor device according to an embodiment form.

FIG. 4 is a diagram for explaining scan test timing according to the semiconductor device of the embodiment form. FIG. 5 is a timing diagram for explaining effects of the semiconductor device according to the embodiment form.

As described in the foregoing, a scan test includes scan-in shifting, capturing, and scan-out shifting.

For a scan test, a scan-in start delay period (Tsis), a scan-in period (Tsi), a capture period (Tca), and a scan-out period (Tso) are variable. Regarding the scan-in start delay period (Tsis), either the time between a scan-test start and a scan-in start or a scan-test start time may be varied. The scan-in period Tsi and scan-out period Tso can be expressed as follows, where n is a scan-shift length (number of scan flip-flops), fs is a scan clock frequency, and Ts is a scan-clock period.

$$Tsi=Tso=n\times 1/fs=n\times Ts$$

Therefore, the scan-in period (Tsi) and scan-out period (Tso) can be varied by changing at least either one of the number of scan flip-flops (n) and scan clock frequency (fs). The number of scan flip-flops (n) can be changed by changing the scan chain configuration.

The capture clock once goes high to be inputted to the scan flip-flops, so that the capture period (Tca) can be changed by changing the low period before the capture clock goes high or by changing the low period after the capture clock goes high (the low period before the next scan clock goes high).

The semiconductor device according to the embodiment form includes a scan circuit for performing a BIST. For the scan circuit, the length of at least one of the scan-in period, scan-out period, and capture period can be changed, and the scan operation start time can also be changed.

Figure 5:
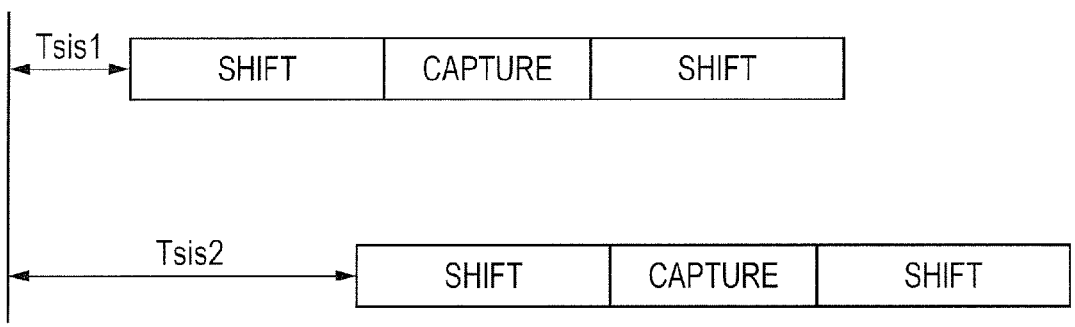
FIG. 5 is a timing diagram for explaining effects of the semiconductor device according to the embodiment form.

For example, when, as shown in FIG. 5, two BISTs are to be performed concurrently, setting the scan-in start time (Tsis1) for the first BIST and the scan-in start time (Tsis2) for the second BIST to be different makes it possible to cause capture operation in which the current consumption is small and shifting operation in which the current consumption is large to take place concurrently. This lowers the rate of current consumption variation and reduces the generation of resonance noise in the power supply line. In this case, it is preferable to equalize, between the two BISTs, the lengths of the scan-in period (Tsi), capture period (Tca), and scan-out period (Tso). This approach is not limited to cases where two BISTs are concurrently performed and is also applicable where three or more BISTs are concurrently performed. Such plural BISTs may be performed in either a single semiconductor device or plural semiconductor devices.

Embodiment Example

Next, a microcontroller configuration according to an embodiment example will be described with reference to FIG. 6.

Figure 6:
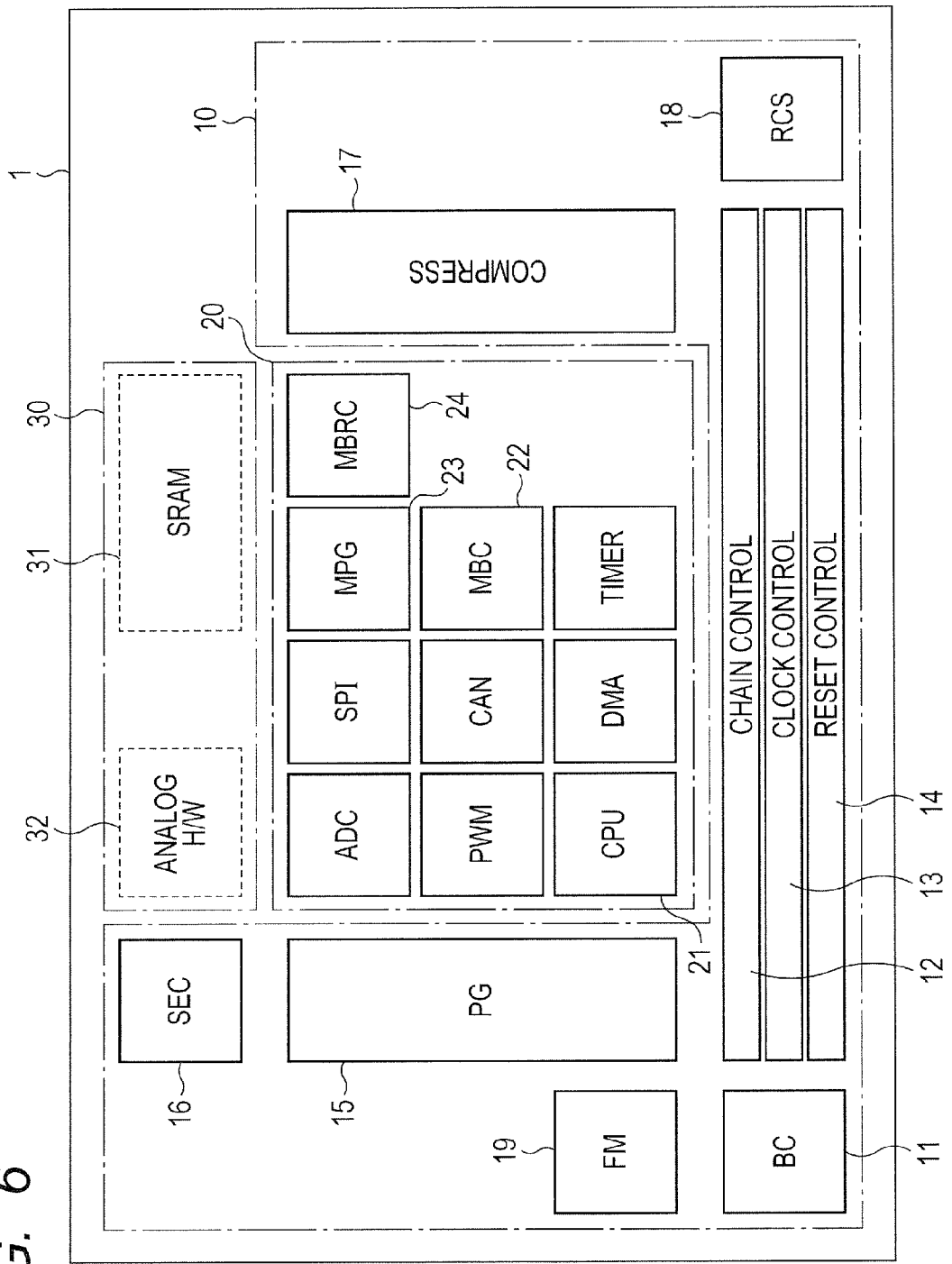
FIG. 6 is a block diagram for explaining the configuration of a microcontroller according to an embodiment example.

FIG. 6 is a block diagram showing the configuration of a microcontroller according to an embodiment example of the present disclosure.

A microcontroller 1 according to the embodiment example is a semiconductor device having a logic unit self-diagnosis (logic BIST) function and a memory unit self-diagnosis (memory BIST) function and including a logic BIST circuit 10, a scan target circuit 20, and a scan non-target circuit 30 which are formed over a semiconductor substrate.

The logic BIST circuit 10 includes a BIST control circuit (BC) 11, a chain control circuit (CHAIN CONTROL) 12, a clock control circuit (CLOCK CONTROL) 13, a reset control circuit (RESET CONTROL) 14, and a pattern generator circuit (PG) 15. The logic BIST circuit 10 further includes a scan enable control circuit (SEC) 16, a compression circuit (COMPRESS) 17, a result compare status circuit (RCS) 18, and a flash memory 19 which is an electrically rewritable non-volatile memory.

The scan target circuit 20 includes such functional blocks of the microcontroller as a central processing unit (CPU) 21, a direct memory access control device (DMA), a timer (TIMER), a PWM generation circuit (PWM), a controller area network (CAN) which is a communication circuit, an A/D converter circuit (ADC), and a serial peripheral interface (SPI). The scan target circuit 20 further includes such memory BIST circuits as a memory BIST control circuit (MBC) 22, a memory pattern generator circuit (MPG) 23, and a memory BIST result check circuit (MBRC) 24. This allows the memory BIST circuit to be scan-tested.

The scan non-target circuit 30 includes an SRAM 31 which is a memory and an analog circuit (ANALOG H/M) 32. Programs to be executed by the CPU 21 and data are stored in the flash memory 19. Programs and the parameters being described later are written to the flash memory 19 after the semiconductor device is manufactured.

The BIST operation by the microcontroller 1 will be described with reference to FIGS. 7 and 8.

Figure 7:
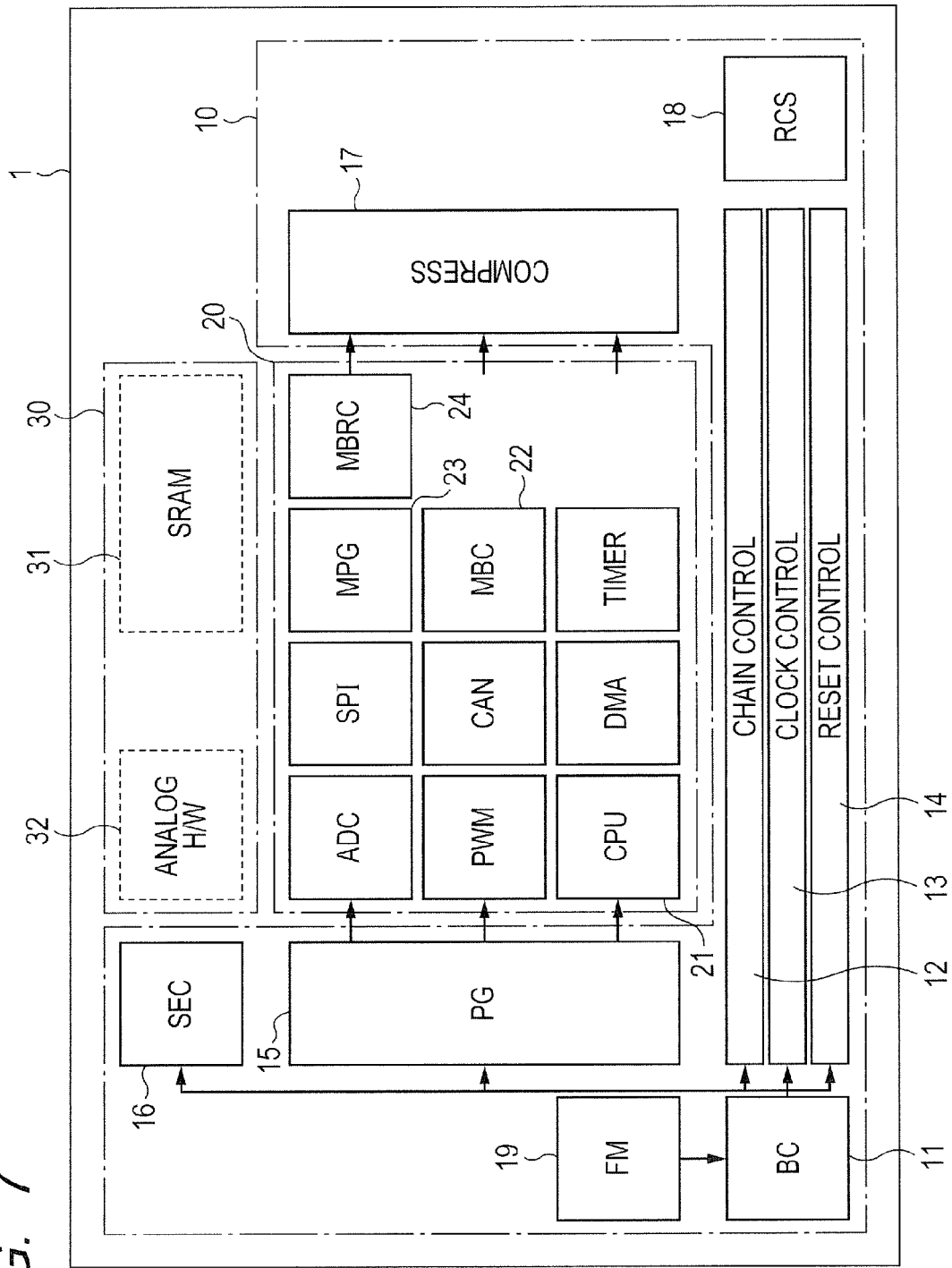
FIG. 7 is a block diagram for explaining operation of the microcontroller according to the embodiment example.
Figure 8:
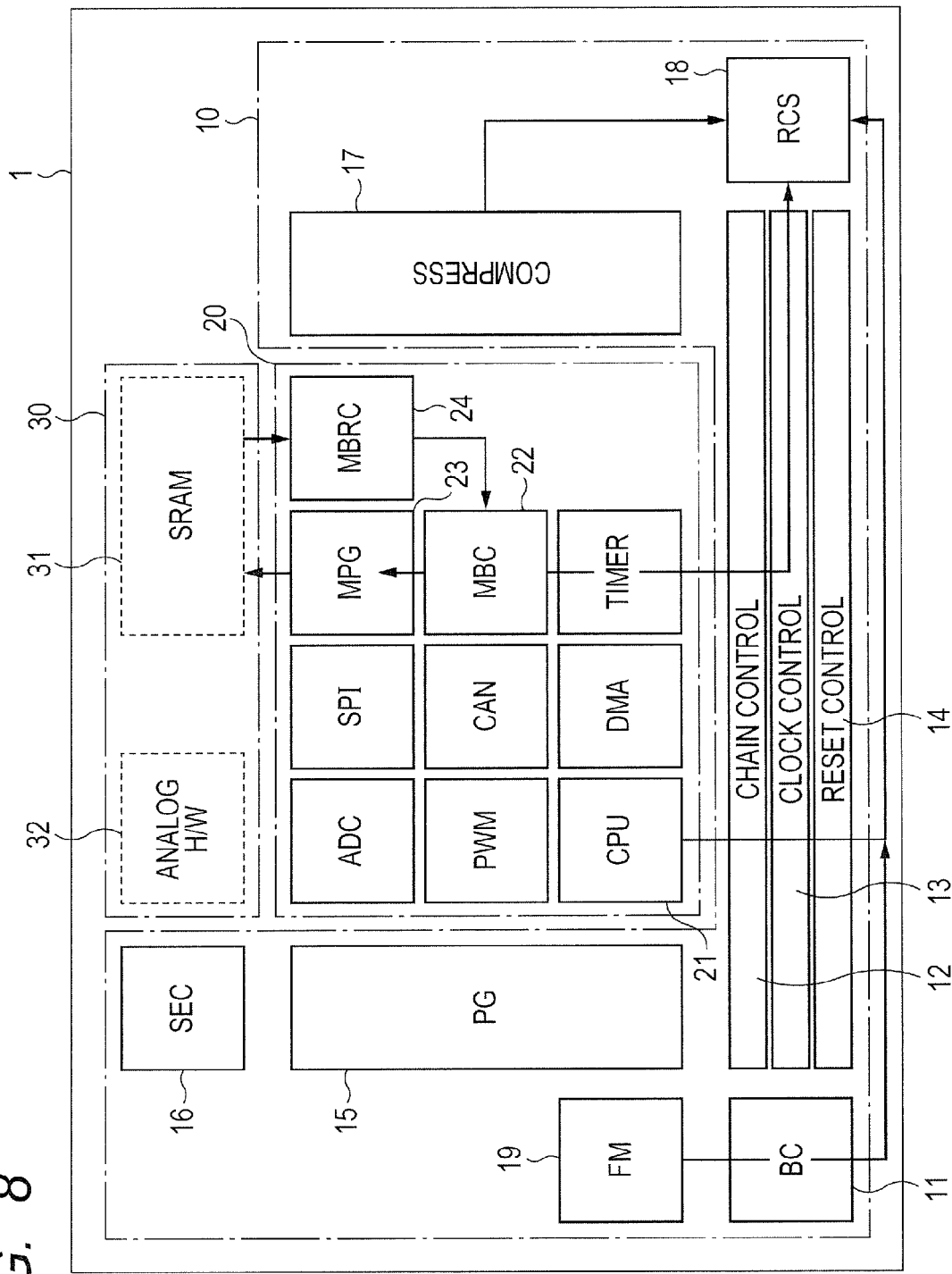
FIG. 8 is a block diagram for explaining operation of the microcontroller according to the embodiment example.

FIG. 7 is a block diagram for explaining BIST operation performed by the microcontroller 1 before a scan test according to the embodiment example. FIG. 8 is a block diagram for explaining BIST operation performed by the microcontroller 1 after a scan test according to the embodiment example.

After a reset release, the BIST control circuit 11 reads parameters from the flash memory 19 and expands the parameters for the chain control circuit 12, clock control circuit 13, reset control circuit 14, pattern generator circuit 15, and scan enable control circuit 16. When a predetermined amount of time elapses after the reset release, a scan test is started. The scan test is started, for example, by starting feeding a scan clock signal to the scan target circuit 20.

The chain control circuit 12 sets a scan chain configuration for the scan test target circuit 20 based on parameters given from the BIST control circuit 11. Details in this regard will be described later.

The clock control 13 controls the scan clock and capture clock during a scan test based on the parameters given from the BIST control circuit 11. The scan start delay time can be changed through setting of scan clock supply start timing. For example, scan clock pulses are counted by a counter and, after a predetermined number of scan clock pulses are counted, the scan clock signal is fed to the scan chain. Also, a scan clock frequency and a capture clock low period are set making it possible to change the scan-in period, scan-out period, and capture period. When a BIST is performed, a scan test including scan-in, capture, and scan-out stages is repeated plural times. It is possible to set the period between an nth scan test and (n+1)th scan test. In this way, BISTs can be performed concurrently for plural semiconductor devices and, furthermore, operation in time-division mode is enabled.

The reset control circuit 14 controls setting and resetting of the flip-flops included in the scan chain to prevent the flip-flops from assuming unexpected values during a scan test.

The pattern generator circuit 15 generates an appropriate scan test pattern for the scan chain based on the parameters given from the BIST control circuit 11. The compression circuit 17 logically compresses scan test results.

After a scan test, test results are compressed in the compression circuit 17 and are then stored in the result compare status circuit 18. A memory test is performed on the SRAM 31 under control by the memory BIST control circuit 22, and test results are stored in the result compare status circuit 18. The CPU 21 starts normal operation and writes expected values stored in the flash memory 19 to the result compare status circuit 18. The result compare status circuit 18 compares the expected values and the test results and holds the comparison results. The CPU 21 reads the comparison results from the result compare status circuit 18 and makes judgment. By having a part of the BIST performed by the CPU 21, the result compare status circuit 18 can be prevented from becoming larger in hardware scale.

Next, the internal configuration of the scan test target block will be described with reference to FIG. 9 and FIG. 1.

Figure 9:
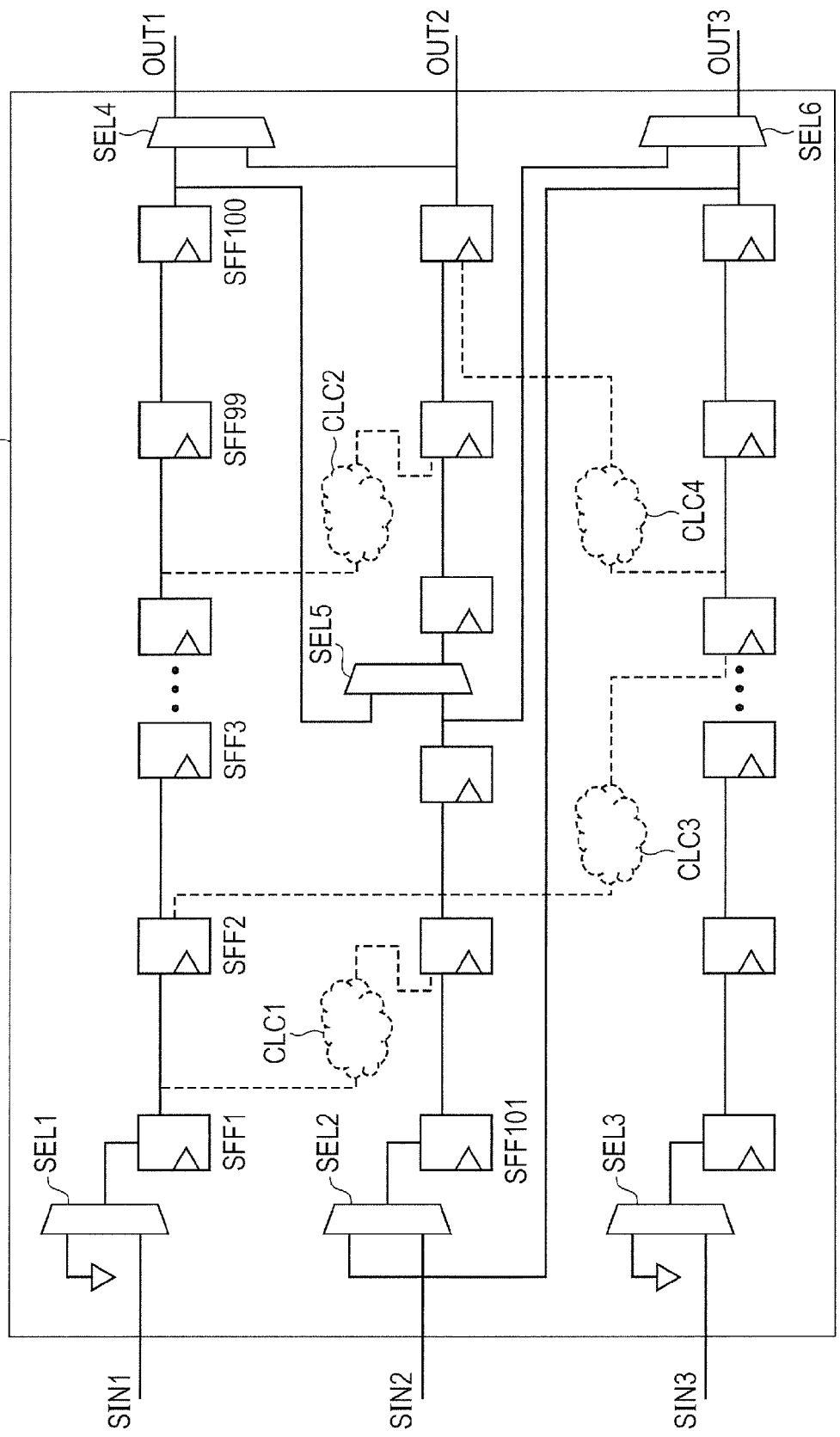
FIG. 9 is a block diagram for explaining the internal configuration of a scan test target block of the microcontroller according to the embodiment example.

FIG. 9 is a block diagram for explaining the internal configuration of the scan test target block of the microcontroller according to the embodiment example.

As seen in FIG. 9, a scan chain is configured to extend laterally. First to third scan-in signals (SIN1, SIN2, SIN3) are inputted as test signals from the left side as seen in FIG. 9. First to third scan-out signals (OUT1, OUT2, OUT3) are outputted from the right side as seen in FIG. 9. As shown in FIG. 1, each scan flip-flop (SFF) includes a flip-flop (FF) having a data input terminal (D) coupled with a multiplexer (MUX). The multiplexer (MUX) inputs either an output signal (IN_CL) of a combinational circuit or an output signal (SCn−1) of the preceding scan flip-flop in the scan chain to the data input terminal (D) of the flip-flop (FF). For this, switching between the two output signals is made based on the scan enable signal (SE). The scan clock signal (CLK) is inputted to the scan flip-flop (SFF) (flip-flop (FF)). Referring to FIG. 9, ordinary logic circuits (combinational circuits) CLS1 to CLC4 other than the test circuits are represented in broken lines. The combinational circuits are located and coupled to scan flip-flops irrelevantly to the scan flip-flop sequence in the scan chain. The respective scan flip-flops (SFFn) are coupled in the scan chain, and the combinational circuits are tested by having flip-flop values for the respective scan flip-flops set (scan-in) and read out (scan-out) through the scan chain. Furthermore, the scan chain according to the present embodiment example includes selectors SEL1 to SEL6 making the scan chain configuration alterable. Namely, the scan chain configuration is defined by the selectors SEL1 to SEL6 that are set based on the parameters given from the BIST control circuit 11.

Figure 10:
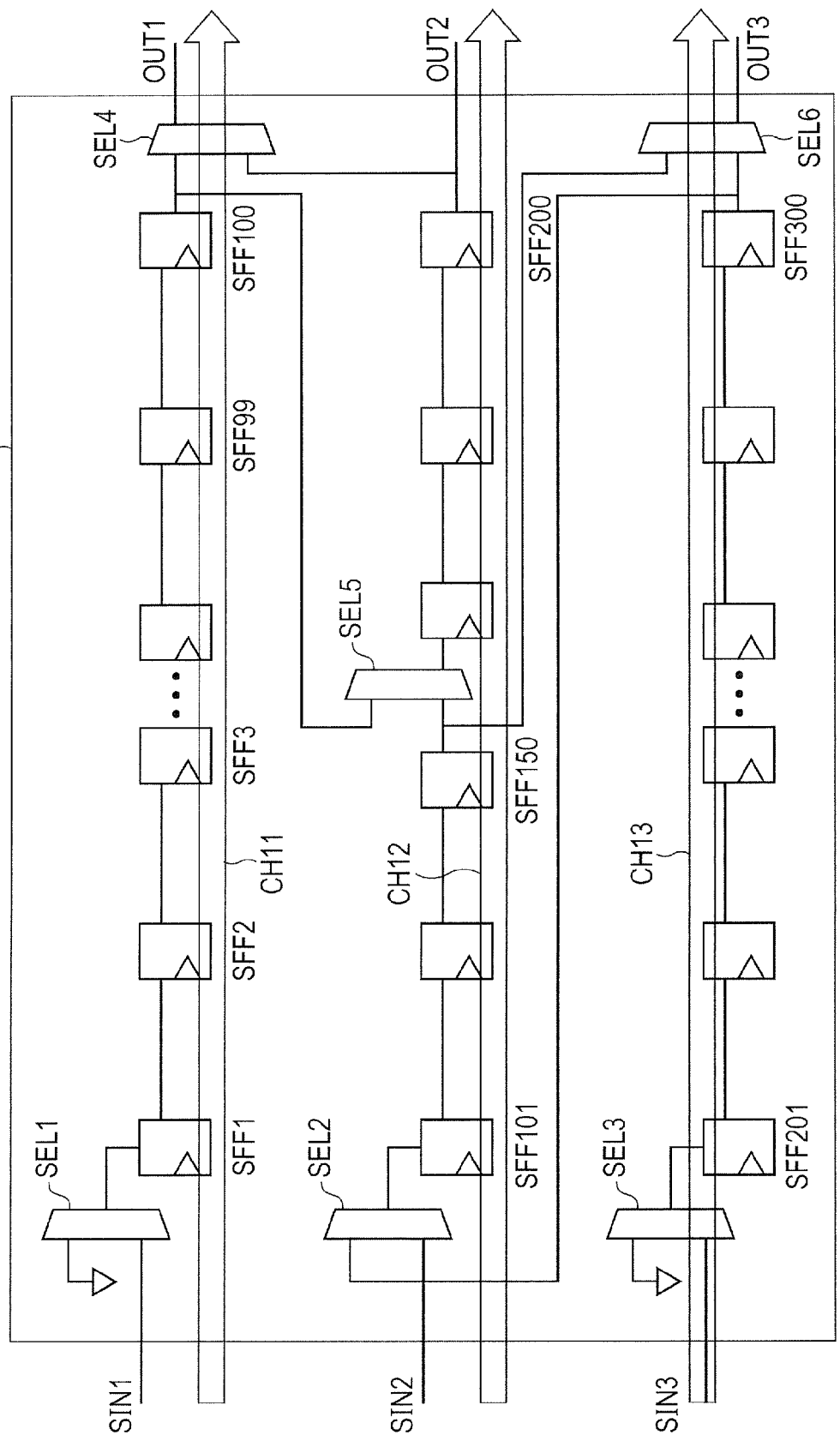
FIG. 10 is a block diagram for explaining a first scan chain configuration example for the microcontroller according to the embodiment example.

Next, a first scan chain configuration example will be described with reference to FIG. 10. FIG. 10 is a block diagram showing the first scan chain configuration example for the microcontroller according to the embodiment example.

In the first scan chain configuration example, the respective selectors select the following signals based on the parameters given from the BIST control circuit 11.

Selector SEL1: First scan-in signal (SIN1)
Selector SEL2: Second scan-in signal (SIN2)
Selector SEL3: Third scan-in signal (SIN3)
Selector SEL4: Output signal of 100th scan flip-flop (SFF100)
Selector SEL5: Output signal of 150th scan flip-flop (SFF150)
Selector SEL6: Output signal of 300th scan flip-flop (SFF300)

In this case, the first scan chain configuration example includes the following three scan chains.

Chain CH11: SIN1, SFF1, SFF2, - - -, SFF100, OUT1
Chain CH12: SIN2, SFF101, - - -, SFF200, OUT2
Chain CH13: SIN3, SFF201, - - -, SFF300, OUT3

The scan chains CH11, CH12 and CH13 include 100 scan flip-flops each.

Figure 11:
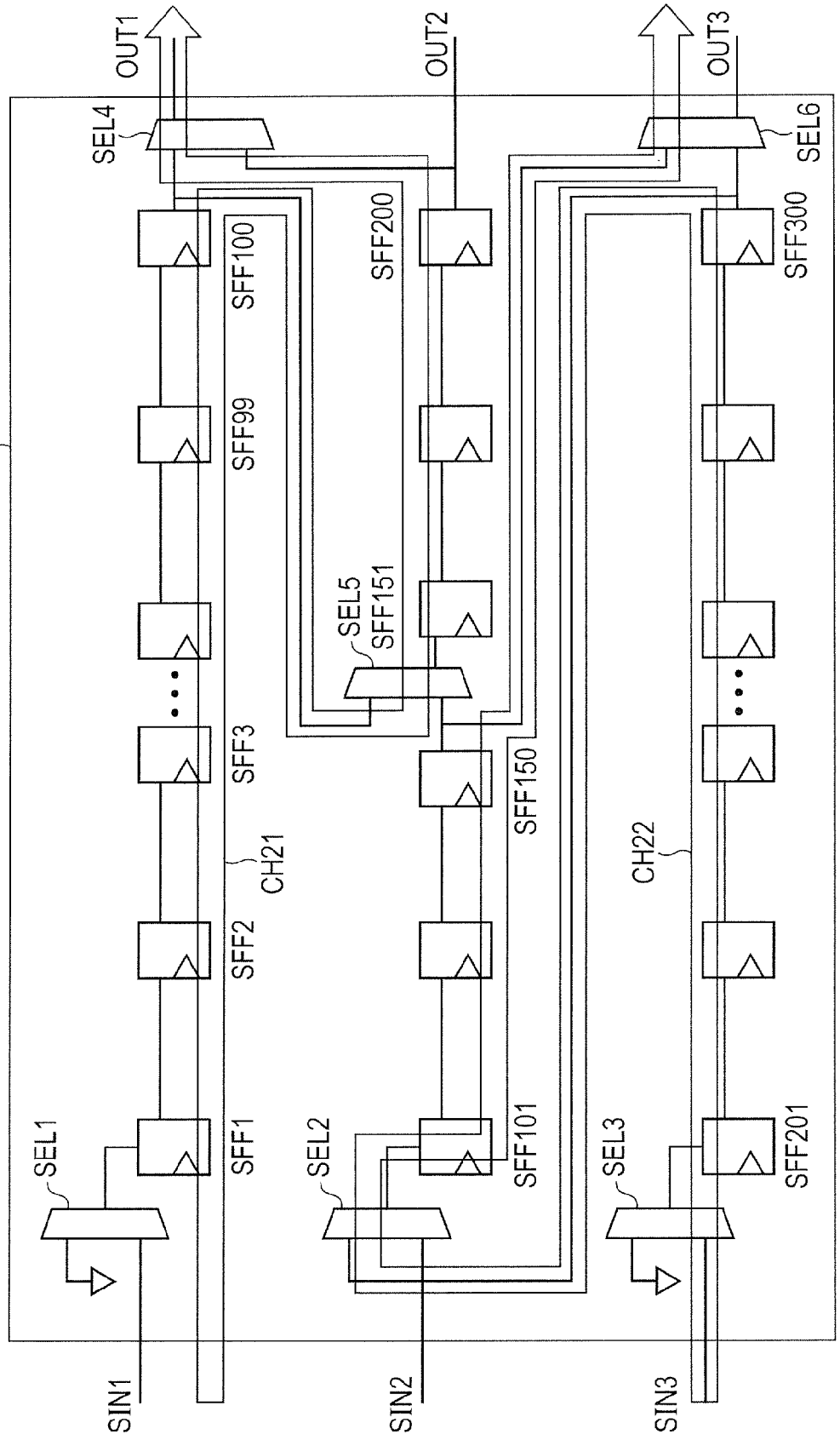
FIG. 11 is a block diagram for explaining a second scan chain configuration example for the microcontroller according to the embodiment example.

Next, a second scan chain configuration example will be described with reference to FIG. 11. FIG. 11 is a block diagram showing the second scan chain configuration example according to the embodiment example.

In the second scan chain configuration example, the respective selectors select the following signals based on the parameters given from the BIST control circuit 11.

Selector SEL1: First scan-in signal (SIN1)
Selector SEL2: Output signal of 300th scan flip-flop (SFF300)
Selector SEL3: Third scan-in signal (SIN3)
Selector SEL4: Output signal of 200th scan flip-flop (SFF200)
Selector SEL5: Output signal of 100th scan flip-flop (SFF100)
Selector SEL6: Output signal of 150th scan flip-flop (SFF150)

In this case, the second scan chain configuration example includes the following two scan chains.

Chain CH21: SIN1, SFF1, SFF2, - - -, SFF100, SFF151, - - -, SFF200, OUT1
Chain CH22: SIN3, SFF201, - - -, SFF300, SFF101, - - -, SFF150, OUT3

The scan chains CH21 and CH22 include 150 scan flip-flops each.

According to the embodiment example, the scan chain configuration can be changed after the semiconductor device is manufactured. With the scan-chain configuration, i.e. the number of scan flip-flops included in each scan chain being alterable, the lengths of the scan-in period and scan-out period can be changed. Also, the length of the capture period can be changed after the semiconductor device is manufactured. This makes it possible to equalize the scan test period between different semiconductor devices. Also, the scan start time can be changed after the semiconductor device is manufactured. Consequently, shift operations requiring long scan test periods, i.e. involving large current consumption, and capture operation to involve small current consumption can be performed concurrently between different semiconductor devices. In this way, the rate of current consumption variation can be lowered.

Application Example 1

Figure 12:
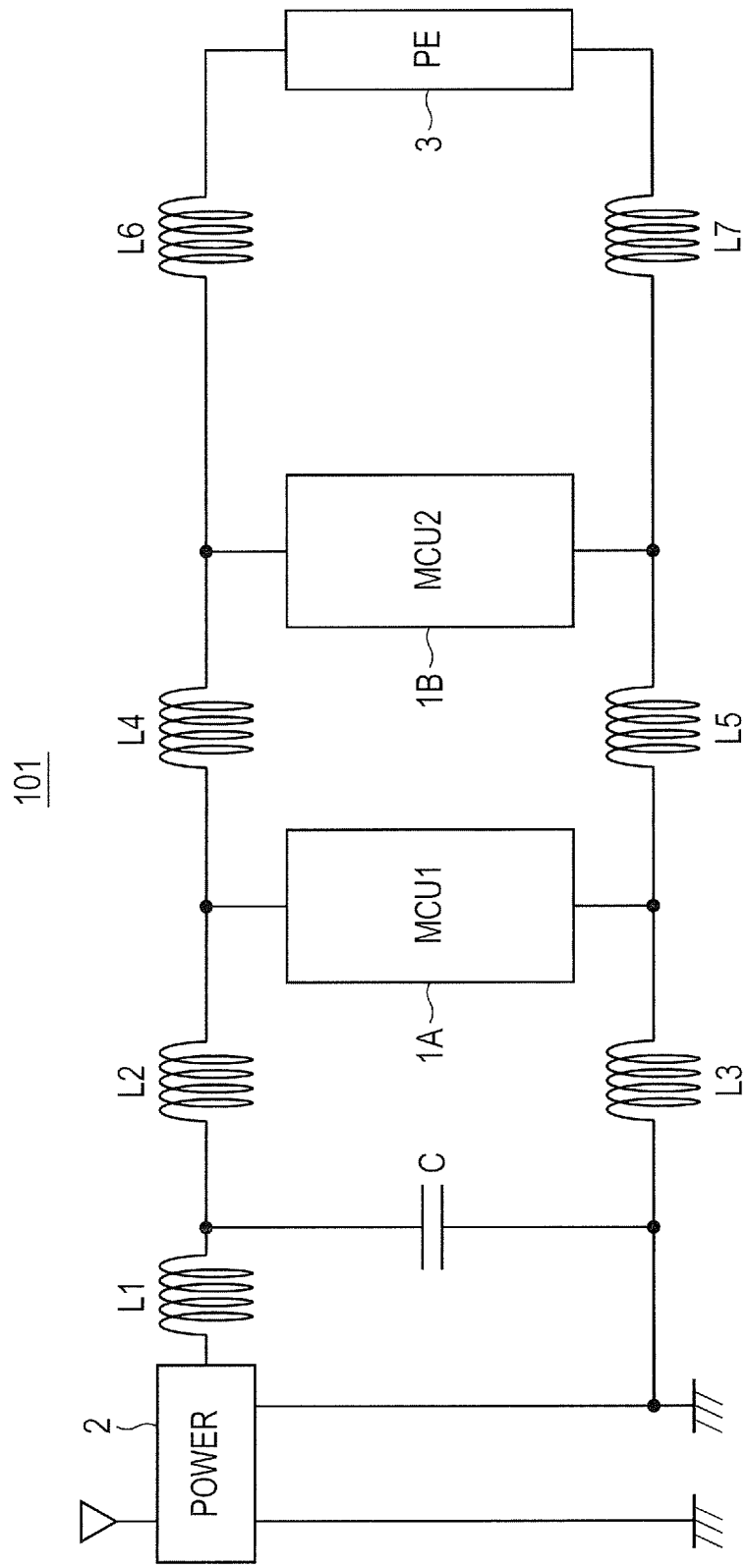
FIG. 12 is a block diagram for explaining the configuration of an electronic device according to application example 1.

Next, the configuration of an electronic device including microcontrollers each with a built-in BIST according to a first application example (application example 1) will be described with reference to FIG. 12. FIG. 12 is a block diagram showing the configuration of the electronic device according to the application example 1.

The electronic device 101 according to the application example 1 includes a first semiconductor device, i.e. a microcontroller (MCU) 1A, a second semiconductor device, i.e. a microcontroller (MCU) 1B, a power supply IC (POWER) 2, and a passive element (PE) 3 which are formed over a single or plural printed circuit boards. The power supply line and ground line coupled between the microcontrollers 1A and 1B and the passive element 3 include such components as inductances L1 to L7 and capacitance C. The electronic device 101 is an electronic control unit (ECU) used for various in-vehicle control, for example, automobile engine control and brake control.

The microcontrollers 1A and 1B are configured similarly to the microcontroller 1 according to the embodiment example. The BIST parameters for the microcontrollers 1A and 1B are set as follows.

(1) Parameters are written to the flash memory of each of the microcontrollers 1A and 1B such that the microcontrollers 1A and 1B have a same scan chain configuration. For example, the parameters used to form the first (or the second) scan chain configuration according to the embodiment example may be set for the microcontrollers 1A and 1B.

(2) The scan test start timing is different between the microcontrollers 1A and 1B. To be specific, during shift operation by the microcontroller 1A, the microcontroller 1B performs capture operation and, during shift operation by the microcontroller 1B, the microcontroller 1A performs capture operation. For example, after completion of shift operation by the microcontroller 1A, the microcontroller 1B starts scan-in shift operation. In this case, the scan test period of the microcontroller 1A including a scan-in period, a capture period, and a scan-out period is equivalent to the scan-test period of the microcontroller 1B. In this way: capture operation by the microcontroller 1A and scan-in operation by the microcontroller 1B are performed concurrently; scan-out operation by the microcontroller 1A and capture operation by the microcontroller 1B are performed concurrently; and scan-in operation by the microcontroller 1A and capture operation by the microcontroller 1B are performed concurrently. This can reduce the rate of current consumption variation and the generation of power supply resonance noise.

In cases where the microcontrollers 1A and 1B are of different types, for example, when the microcontroller 1A has a fixed scan chain configuration including 150 scan flip-flops, the microcontroller 1B may be configured like the foregoing second scan chain configuration example.

Application Example 2

Figure 13:
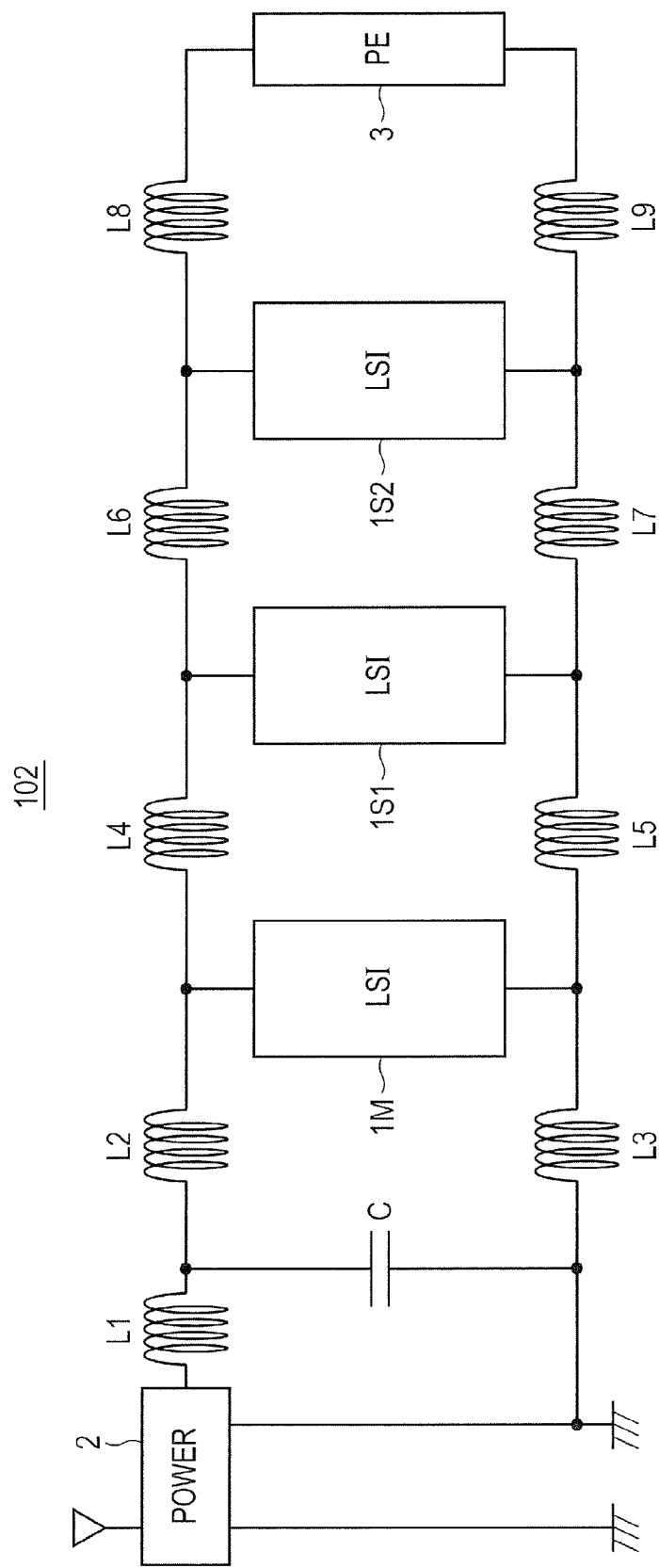
FIG. 13 is a block diagram for explaining the configuration of an electronic device according to application example 2.
Figure 14:
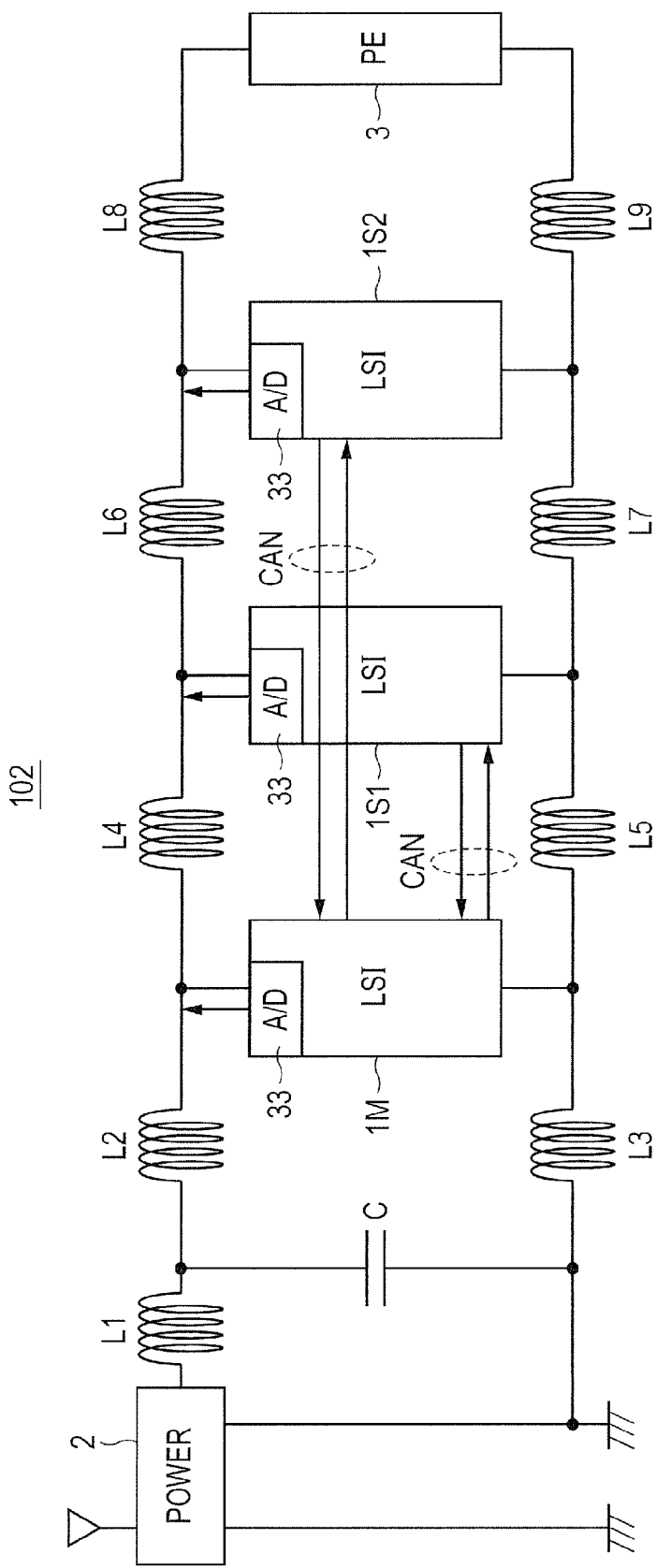
FIG. 14 is a block diagram for explaining a first operation of the electronic device according to the application example 2.

Next, the configuration of an electronic device including a microcontroller with a built-in BIST according to a second application example (application example 2) will be described with reference to FIGS. 13 to 15. FIG. 13 is a block diagram showing the configuration of the electronic device according to the application example 2. FIG. 14 is a block diagram showing a first operation of the electronic device according to the application example 2. FIG. 15 is a block diagram showing a second operation of the electronic device according to the application example 2.

The electronic device 102 according to the application example 2 includes a semiconductor device (LSI) 1M on the master side, a semiconductor device (LSI) 1S1 on the slave side, a semiconductor device (LSI) 1S2 on the slave side, a power supply IC2, and a passive element 3 which are formed over a single or plural printed circuit boards. The power supply line and ground line coupled between the power supply IC2, semiconductor devices 1M, 1S1 and 1S2, and passive element PE include such components as inductances L1 to L9 and capacitance C. Like the electronic device 101, the electronic device 102 is an electronic control unit (ECU) used for various in-vehicle control, for example, automobile engine control and brake control.

The semiconductor devices 1M, 1S1 and 1S2 are configured similarly to the microcontroller 1 according to the embodiment example, except that the semiconductor devices 1M, 1S1 and 1S2 each include, as a non-scan target circuit, an A/D converter circuit 33 for supply voltage monitoring. The semiconductor device 1M may be referred to as a first semiconductor device, and the semiconductor device 1S1 or 1S2 may be referred to as a second semiconductor device.

The first operation of the electronic device according to the application example 2 will be described with reference to FIG. 14.

(A1) The supply voltage monitoring A/D converter circuit 33 of the semiconductor device 1M monitors the supply voltage between the inductances L2 and L4 during a scan test. Similarly, the supply voltage monitoring A/D converter circuit 33 of the semiconductor device 1S1 monitors the supply voltage between the inductances L4 and L6 during a scan test. The supply voltage monitoring A/D converter circuit 33 of the semiconductor device 1S2 monitors the supply voltage between the inductances L6 and L8 during a scan test.

(A2) After a scan test, the semiconductor devices 1S1 and 1S2 on the slave side each transfer supply voltage variation data to the semiconductor device 1M, for example, via a CAN.

(A3) The parameters are re-calculated at the semiconductor device 1M on the master side, and the re-calculated parameters are communicated to the semiconductor devices 1S1 and 1S2 on the slave side. When the supply voltage variation is larger than a predetermined threshold, resonance is determined to have occurred and the scan chain configuration is changed. For example, the parameters are changed to increase or decrease the number of scan flip-flops in the semiconductor device 1M on the master side.

(A4) When the BIST is performed next time and thereafter, the new parameters set as described in (A3) above are applied.

In the first operation according to the application example 2, the actual supply voltage variation is monitored making it possible to reduce the power supply resonance noise more than in the application example 1.

The second operation of the electronic device according to the application example 2 will be described with reference to FIG. 15.

(B1) Similarly to the supply voltage monitoring described in (A1) above, the supply voltages for the semiconductor devices 1M, 1S1 and 1S2 are monitored at the respective supply voltage monitoring A/D converter circuits 33 during a scan test.

(B2) Similarly to the data transfer described in (A2) above, data about the supply voltage variation detected as described in (B1) above is transferred to the semiconductor device 1M, for example, via a CAN.

(B3) The parameters are re-calculated at the semiconductor device 1M on the master side. At this time, the parameters are re-set taking into account an abnormal current portion flowing through the passive element 3. When the capacity of the power supply IC2 is exceeded, the BIST is shifted from concurrent operation to time-division operation and the error status is notified. In this way, the BIST can be performed even when the power supply capacity is exceeded.

When there is a fault, for example, short-circuiting in the passive element 3, an abnormal current (Iab) steadily flows between the power supply and ground through the passive element 3. In this state, the three semiconductor devices 1M, 1S1 and 1S2 use the current supplied from the power supply IC2 less the abnormal current (Iab). Namely, the operating current available to the three semiconductor devices is smaller than available in a normal state. Therefore, when an element fault is detected, the scan chain configuration (number of scan flip-flops) is changed. In addition, the scan clock frequency for each of the three semiconductor devices 1M, 1S1 and 1S2 is changed to be lower than in a normal fault-less state. In this way, the BIST can be performed even when the available operating current is reduced, for example, due to a fault in a passive element.

The invention made by the present inventors has been described in concrete terms based on an embodiment form, an embodiment example and application examples. However, the invention is not limited to the above embodiment form, embodiment example and application examples and can be modified in various ways.

What is claimed is:

1. A semiconductor device comprising:
   a self-diagnosis control circuit;
   a scan target circuit including a combinational circuit and scan flip-flops; and
   an electrically rewritable non-volatile memory,
   wherein a scan chain is configured by coupling a plurality of the scan flip-flops, and
   wherein, in accordance with parameters stored in the non-volatile memory, the self-diagnosis control circuit is configured to:
      change a length of at least one of a scan-in period in which test data is inputted to the scan chain and a scan-out period in which a test result is outputted from the scan chain by changing a shift frequency of the scan chain, and
   change a length of a capture period in which a test result on the combinational circuit is captured into the scan chain by changing a low period of a capture clock capturing the test result.

2. The semiconductor device according to claim 1, further comprising
   a scan chain control circuit,
   wherein the scan target circuit includes a selector for switching between outputs of the scan flip-flops, and
   wherein the scan chain control circuit is configured to change a scan chain configuration by controlling the selector in accordance with parameters stored in the non-volatile memory.

3. The semiconductor device according to claim 2, wherein the scan target circuit includes a plurality of concurrently operational scan chains.

4. The semiconductor device according to claim 2, wherein the number of scan flip-flops coupled in the scan chain can be changed.

5. The semiconductor device according to claim 1, further comprising:
   a clock control circuit,
   wherein the clock control circuit is configured to change a shift clock frequency for the scan chain in accordance with parameters stored in the non-volatile memory.

6. The semiconductor device according to claim 1, further comprising:
   a clock control circuit,
   wherein, in accordance with parameters stored in the non-volatile memory, the clock control circuit is configured to change the low period of the capture clock capturing the test result on the combinational circuit into the scan chain.

7. The semiconductor device according to claim 1, further comprising:
 a pattern generation circuit to generate test data;
 a compression circuit to compress a scan test result; and
 a comparison result circuit to store a compression result,
 wherein an expected scan test result value is stored in the non-volatile memory.

8. The semiconductor device according to claim 7,
 wherein the scan target circuit includes a CPU which writes the expected scan test result value stored in the non-volatile memory to the scan target circuit to cause the scan target circuit to compare the scan test result with the expected scan test result value.

9. The semiconductor device according to claim 1, further comprising:
 a self-diagnosis non-target circuit including a memory; and
 a memory self-diagnosis circuit to self-diagnose the memory,
 wherein the self-diagnosis non-target circuit includes the memory self-diagnosis circuit.

10. The semiconductor device according to claim 9,
 wherein the memory self-diagnosis circuit includes:
 a memory self-diagnosis control circuit;
 a memory pattern generation circuit; and
 a memory self-diagnosis result checking circuit.

11. The semiconductor device according to claim 1,
 wherein each of the scan flip-flops includes a multiplexer and a flip-flop, the multiplexer switching between an output of the combinational circuit and an output of a scan flip-flop for input to the flip-flop.

12. The semiconductor device according to claim 1,
 wherein the scan target circuit includes a plurality of concurrently operational scan chains, and
 wherein, in accordance with parameters stored in the non-volatile memory, the self-diagnosis control circuit is further configured to set different scan start times for the plurality of scan chains.

\* \* \* \* \*